(12) United States Patent
Frühauf et al.

(10) Patent No.: US 11,506,530 B2
(45) Date of Patent: Nov. 22, 2022

(54) DIAGNOSIS OF A TWO-CONDUCTOR FIELD INSTRUMENT

(71) Applicant: Endress+Hauser SE+Co. KG, Maulburg (DE)

(72) Inventors: Dietmar Frühauf, Lörrach (DE); Armin Wernet, Rheinfelden (DE)

(73) Assignee: Endress+Hauser SE+Co. KG, Maulburg (DE)

( * ) Notice: Subject to any disclaimer, the term of this patent is extended or adjusted under 35 U.S.C. 154(b) by 116 days.

(21) Appl. No.: 17/252,154

(22) PCT Filed: May 10, 2019

(86) PCT No.: PCT/EP2019/062102
§ 371 (c)(1),
(2) Date: Dec. 14, 2020

(87) PCT Pub. No.: WO2019/238322
PCT Pub. Date: Dec. 19, 2019

(65) Prior Publication Data
US 2021/0164827 A1     Jun. 3, 2021

(30) Foreign Application Priority Data
Jun. 14, 2018 (DE) ..................... 10 2018 114 302.8

(51) Int. Cl.
*G01F 23/24* (2006.01)
*G01F 23/26* (2022.01)
(Continued)

(52) U.S. Cl.
CPC .............. *G01F 25/24* (2022.01); *G01F 23/24* (2013.01); *G01F 23/263* (2013.01); *G01N 27/028* (2013.01); *G01R 31/2829* (2013.01)

(58) Field of Classification Search
CPC .......... G01F 25/24; G01F 23/24; G01F 23/26; G01F 23/263; G01F 23/28; G01F 23/284;
(Continued)

(56) References Cited

U.S. PATENT DOCUMENTS

| | | |
|---|---|---|
| 2005/0168343 A1 | 8/2005 | Longsdorf et al. |
| 2008/0156090 A1* | 7/2008 | Wehrs ...................... G01M 3/16 73/290 R |
| 2017/0160727 A1 | 6/2017 | Ishikawa et al. |

FOREIGN PATENT DOCUMENTS

EP     1860513 A2    11/2007

\* cited by examiner

*Primary Examiner* — Son T Le
(74) *Attorney, Agent, or Firm* — Mark A. Logan; Endress+Hauser (USA) Holding Inc.

(57) ABSTRACT

Disclosed is a method for diagnosis of a two-conductor field instrument and a corresponding two-conductor field instrument. In a normal operating mode, an input voltage is provided and an output current is output. In a diagnostic operating mode, the method includes: providing a first diagnosis-input voltage and outputting a first diagnosis-output current during a first time interval, providing a second diagnosis-input voltage and outputting a second diagnosis-output current during a second time interval, determining the second time interval from the first time interval, registering a first and second diagnosis-output voltage as a function of the first and second diagnosis-output current, and checking the functionality of the two-conductor field instrument by the first and second diagnosis-input voltage, the first and second time interval, the first and second diagnosis-output electrical current, the first and second diagnosis-output voltage based on the input voltage and/or based on the output electrical current.

15 Claims, 5 Drawing Sheets

(51) Int. Cl.
 *G01N 27/02* (2006.01)
 *G01F 25/20* (2022.01)
 *G01F 23/263* (2022.01)
 *G01R 31/28* (2006.01)

(58) Field of Classification Search
 CPC .... G01N 27/02; G01N 27/028; G01N 27/221; G01R 31/28; G01R 31/2829; G05B 23/0256
 See application file for complete search history.

DIAGNOSIS OF A TWO-CONDUCTOR FIELD INSTRUMENT

CROSS-REFERENCE TO RELATED APPLICATIONS

The present application is related to and claims the priority benefit of German Patent Application No. 10 2018 114 302.8, filed on Jun. 14, 2018 and International Patent Application No. PCT/EP2019/062102, filed on May 10, 2019, the entire contents of which are incorporated herein by reference.

TECHNICAL FIELD

The invention relates to a method for diagnosis of a two-conductor field instrument for determining and/or monitoring at least one process variable of a medium in a containment, as well as to a corresponding two-conductor field instrument. The medium is, for example, a gas, a liquid, or a bulk good. The containment, in turn, is, for example, a container or a pipeline.

BACKGROUND

Field devices of automation technology serve for registering and/or influencing various process variables. In the context of the present invention, all devices are referred to as field instruments, which are applied near to the process and which deliver, or process, process relevant information.

Measuring devices for registering various process variables include, in this connection, for example, fill level measuring devices, flow measuring devices, pressure- and temperature measuring devices, pH- and/or pH-redox potential measuring devices, and even conductivity measuring devices, which serve to register corresponding process variables, fill level, flow, pressure, temperature, pH value, redox potential, and conductivity. The associated measuring principles of such field instruments are sufficiently known in the state of the art, and are not individually set forth here. Depending on applied measuring principle, for example, in the case of flow measuring devices, one distinguishes between Coriolis-, ultrasonic, vortex-, thermal and/or magnetically inductive flow measuring devices. Fill level measuring devices include especially microwave, fill level measuring devices, ultrasonic, fill level measuring devices, time domain reflectometric, fill level measuring devices (TDI), radiometric, fill level measuring devices, capacitive, fill level measuring devices, conductive, fill level measuring devices and/or temperature sensitive, fill level measuring devices. In the case of pressure measuring devices, in contrast, there are absolute-, relative- or pressure difference measuring devices, while temperature measuring devices have frequently thermocouples or temperature dependent resistances for ascertaining the temperature.

Serving for influencing process variables are, in turn, as a rule, actuators, valves, and/or pumps, by means of which, for example, flow in a pipeline or fill level in a container can be influenced.

In the context of the present invention, in principle, also remote I/Os, radio adapters, and, generally, electronic components, which are arranged at the field level, are referred to as field instruments.

A large number of these examples of field instruments are produced and sold by the Endress+Hauser group of companies.

In large industrial plants, field instruments are frequently connected with superordinate units, for example, control systems or control units, via bus systems, such as e.g. Profibus, or Foundation Fieldbus, bus systems. Such superordinate units serve, among other things, for process control, process visualizing, process monitoring and/or for start-up of field instruments.

In endangered regions, especially in explosion endangered atmospheres, preferably so-called two-conductor fieldbusses are used, such as e.g. Profibus PA or Foundation Fieldbus. In the case of such bus systems, both energy supply of the two-conductor field instrument as well as also data transmission from the field instrument (slave) to the superordinate unit (master) occur via the same conductor pair. For sending measurement data from the field instrument to the superordinate unit, the electrical current flow is modulated by the field instrument. By analysis of the electrical current modulation, the superordinate unit can obtain various data, especially measurement data, from the field instrument.

Electrical current loops for data transmission are frequently designed for 4-20 mA interfaces and even according to the NAMUR standard. In the case of a 4-20 mA interface, the measurement data are mapped to an electrical current in the range between 4 mA and 20 mA. Moreover, also failure information can be transmitted by means of the electrical current loop. For example, it can be evaluated, whether the particular loop current is too large or too small and correspondingly should no longer be interpreted as a measured value. If the electrical current corresponds to a predeterminable failure current, then an alarm is output. Selected as predeterminable failure currents, in such case, are electrical current values, which lie outside the 4-20 mA range. Typical values are, for example, 3.6 mA for a so-called "low-alarm" and 22 mA for a so-called "high-alarm".

For many applications, especially in the case of safety-critical applications, it is of great importance that the measured value transmission as well as the sending of failure information are reliably possible. In order to assure this, the standards IEC 61508 and IEC 61511, for example, define different requirements, which a field instruments must satisfy. For assuring a high functional safety in connection with two-conductor field instruments, it is known in the state of the art to monitor, for example, whether an electrical current set in an electrical current loop corresponds to the actual value of the measured variable to be represented. In this connection, different measures have been proposed, such as described, for example, in the documents, EP1860513A1, U.S. Pat. No. 7,098,798B2, and DE02008001832A1.

SUMMARY

Starting from the state of the art, an object of the present invention is to provide, in simple manner, a high functional safety for two-conductor field instruments.

The object is achieved by the method as defined in claim 1 as well as by the two-conductor field instrument as defined in claim 5. Advantageous embodiments are set forth in the dependent claims.

Regarding the method, the object underpinning the invention is achieved by a method for diagnosis of a two-conductor field instrument for determining and/or monitoring at least one process variable of a medium in a containment. In a normal operating mode, an input voltage is provided and an output current is output. In a diagnostic operating mode, a functionality of the two-conductor field instrument is checked, wherein the diagnostic operating mode comprises at least method steps as follows:

providing a first diagnosis-input voltage and outputting a first diagnosis-output electrical current during a first time interval, providing a second diagnosis-input voltage and outputting a second diagnosis-output electrical current during a second time interval, determining the second time interval at least starting from the first time interval, registering a first and/or second diagnosis-output voltage as a function of the first and/or second diagnosis-output current, and checking the functionality of the two-conductor field instrument at least based on the first and/or second diagnosis-input voltage, the first and/or second time interval, the first and/or second diagnosis-output electrical current, the first and/or second diagnosis-output voltage, based on the input voltage and/or based on the output electrical current.

The input voltage and/or the output current in the normal operating mode represent(s) the process variable of interest.

The normal operating mode and the diagnostic operating mode can be performed, for example, alternately, or intermittently. The method and/or the field instrument can, however, also be embodied in such a manner that the diagnostic operating mode is manually triggerable, for example, as a result of actuating a switching element by an operator. Likewise, it is possible to perform the diagnostic operating mode virtually simultaneously with the normal operating mode. Advantageously in this connection, the two time intervals for the diagnostic operating mode are selected to be short, preferably, such that the time intervals lie in the range from a few milliseconds to about 100 milliseconds. Thus, the preoccupations of a superordinate unit, to which the output current is transmitted, can be utilized. Then the superordinate unit, in principle, does not notice that the field instrument is at times operated in a diagnostic operating mode.

The second time interval can, for example, be calculated based on the first time interval and at least one additional variable, for example, the first and/or second diagnosis-input voltage and/or the input voltage in the normal operating mode.

Advantageously, different functionalities of the field instrument can be checked by means of the method of the invention. In this way, a high functional safety of a field instrument can be assured. For example, it can be checked whether failure information is correctly transmitted, or whether an electrical current set in the electrical current loop, the output current, corresponds to the actual value of the measured variable to be represented. Also, in given cases, deductions can be drawn concerning functionality of individual components of the field instrument.

In a preferred embodiment, it is checked whether the two-conductor field instrument can output a predeterminable failure current, especially a predeterminable maximum value or a predeterminable minimum value, for the output current. It can, for example, thus be checked, whether the above mentioned "high-alarm" and/or "low-alarm" are/is issuable.

Alternatively or supplementally, another preferred embodiment provides that it is checked whether an output current belonging to a predeterminable input voltage is burdened with an error. It can in this connection thus be checked, for example, whether an electrical current set in the electrical current loop, the output current, corresponds to the actual value of the measured variable to be represented.

Moreover, it can be checked whether a defect in the electronics, especially in a component of the electronics, is present. For example, information concerning functionality of the electronics, especially a component of the electronics, can be gained based on the first and/or second diagnostic output voltage or based on a behavior of the first and/or second diagnostic output voltage during the first and/or second time interval.

The checking of the functionality of the two-conductor field instrument can occur, for example, by a direct checking of the first and/or second diagnosis-input voltage, the first and/or second time interval, the first and/or second diagnosis-output electrical current and/or the first and/or second diagnosis-output voltage, for example, based on a comparison with one or more reference values. On the other hand, however, also an indirect checking can be performed, in the case of which expected values of at least one determined variable, for example, the second time interval, are ascertained, by means of which, for example, a comparison with values ascertained in ongoing operation is performed and a deviation occurring in given cases is determined. It is to be noted here that, besides the described options, numerous other methods for checking the functionality of the two-conductor field instrument are possible, which likewise fall within the scope of the present invention.

Another especially preferred embodiment of the method provides that the second time interval is determined starting from the first time interval in such a manner that a value of a first integral of a difference between the input voltage and the first diagnosis-input voltage over the first time interval and a value of a second integral of a difference between the input voltage and the second diagnosis-input voltage over the second time interval are essentially equal in magnitude.

During the diagnostic operating mode, there results, in this case, advantageously a DC fraction free modulation of the electrical current output. The time integral over the duration of the diagnostic operating mode, thus, over the first and second time intervals, is zero.

An embodiment of the method of the invention includes, additionally, that the second time interval is determined as a function of input voltage.

The object underpinning the invention is, moreover, achieved by a two-conductor field instrument for determining and/or monitoring at least one process variable of a medium in a containment, comprising an electronics having a diagnostic unit. The electronics is embodied in a normal operating mode to provide an input voltage and to output an output current, and in a diagnostic operating mode to check a functionality of the two-conductor field instrument. The diagnostic unit is embodied, during a first time interval to provide a first diagnosis-input voltage and to output a first diagnosis-output current, during a second time interval to provide a second diagnosis-input voltage and to output a second diagnosis-output current, to determine the second time interval at least starting from the first time interval, as a function of the first and/or second diagnosis-output current to register a first and/or second diagnosis-output voltage, and, based on the first and/or second diagnosis-input voltage, the first and/or second time interval, the first and/or second diagnosis-output electrical current, the first and/or second diagnosis-output voltage, based on the input voltage and/or based on the output electrical current, to check the functionality of the two-conductor field instrument.

In an embodiment, the electronics includes at least one switching element. For example, at least one switching element can be provided for activating, or deactivating, the diagnostic operating mode. A switching element can serve, supplementally or moreover, to switch back and forth between the first diagnosis-input voltage and the second diagnosis-input voltage. Of course, other switching elements can be present, which undertake other switching functions.

An embodiment of the field instrument additionally includes that the electronics includes at least one resistor, which serves for producing the first and/or second diagnosis-output voltage.

In an additional embodiment, the diagnostic unit includes a computing unit, which is embodied to ascertain the second time interval at least based on the first time interval. Stored in the computing unit can be, for example, a formula for determining the second time interval. The second time interval ascertained by means of the computing unit can serve, for example, also as expected value.

Alternatively or moreover, the second time interval can in another embodiment, however, also be determined by analog means without aid of a computing unit.

Thus, another embodiment includes that the diagnostic unit has a control unit, which has at least one subtractor unit, integrator unit and comparator. By means of the control unit, the second time interval can be determined starting from the first time interval.

In this regard, the integrator unit advantageously comprises at least one capacitor and one resistor. It is likewise advantageous that the integrator unit includes at least one switching element, which is, for example, arranged and/or embodied in such a manner that the integrator unit can be placed in a predeterminable starting state before beginning the diagnostic operating mode by actuating the switching element.

Regarding the subtractor unit, it is advantageously embodied to ascertain the difference between a reference signal and the input voltage. In this regard, it is, in turn, advantageous that the reference signal involves the first and/or second diagnosis-input voltage or the first and/or second diagnosis-output voltage.

Regarding the comparator, it is, in turn, advantageous that the comparator is embodied to ascertain the second time interval based on an input voltage of the integrator unit. Especially, the second time interval can be determined based on the reaching of a predeterminable value for an input voltage applied to the comparator, for example, based on the reaching of the value for the input voltage applied to the comparator at the beginning of the first time interval.

Another embodiment of the two-conductor field instrument of the invention includes, finally, that the electronics comprises a monostable multivibrator.

It is to be noted here that the embodiments described in connection with the method of the invention can be applied mutatis mutandis also in the field instrument of the invention and vice versa.

BRIEF DESCRIPTION OF THE DRAWINGS

The invention as well as advantageous embodiments thereof will now be described in greater detail based on the appended drawing, the figures, FIG. 1-FIG. 6, of which show as follows.

In the figures, equal elements are provided with equal reference characters.

DETAILED DESCRIPTION

The present invention concerns generally two-conductor field instruments. Such field instruments can be extremely varied, such as already indicated above in the introduction of the description. By way of example, in the following the operations of a vibronic sensor and a capacitive and/or conductive field instrument will be briefly explained, each embodied in the form of a two-conductor field instrument. The present invention is, however, not limited to these two types of field instruments.

Figure 1:
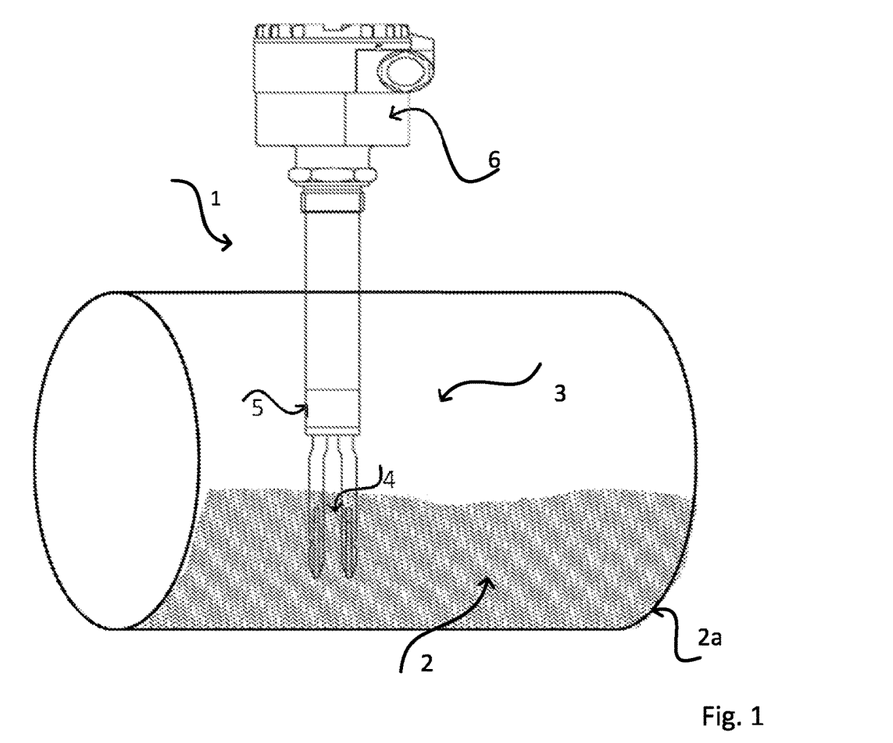
FIG. 1 shows a schematic view of a vibronic sensor according to the state of the art implemented in the form of a two-conductor field instrument.

FIG. 1 shows a field instrument 1 in the form of a vibronic sensor, by means of which, for example, a predetermined fill level of a medium 2 in a container 2a can be monitored, and even the density and/or viscosity of the medium 2 can be ascertained. The sensor unit 3 includes a mechanically oscillatable unit 4 in the form of an oscillatory fork, which extends partially into the medium 2. Other embodiments of a mechanically oscillatable unit 4 known and falling within the scope of the invention are represented, for example, by a single rod or a membrane. Mechanically oscillatable unit 4 is excited by means of the driving/receiving unit 5, which is supplied with an excitation signal, such that mechanical oscillations are executed. Such can be, for example, a four-quadrants drive or a bimorph drive. Shown, furthermore, is an electronics 6, by means of which signal evaluation and/or feeding occurs.

Figure 2:
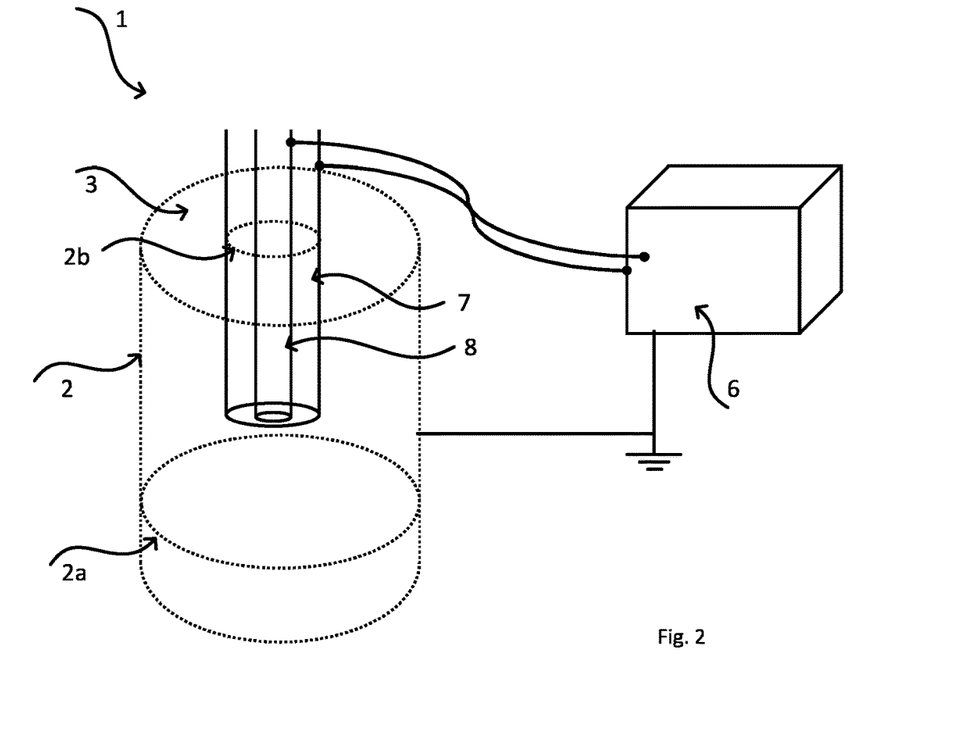
FIG. 2 shows a schematic view of a capacitive and/or conductive, fill level measuring device according to the state of the art implemented in the form of a two-conductor field instrument.

FIG. 2 shows a schematic drawing of a typical field instrument 1 based on the capacitive measuring principle according to the state of the art. The example shows a sensor unit 3 with two cylindrically embodied electrodes 7 and 8. Sensor unit 3 protrudes via a process connection 2b inwardly from above into the container 2a filled partially with medium 2. Other embodiments of capacitive and/or conductive measuring devices can, of course, have another number and/or different embodiments of the electrodes 7, 8. Furthermore, besides such measuring devices 1, in the case of which the sensor unit 3 protrudes, such as shown in FIG. 2, from above into the container 2a, also sensor units 3 can be used, which are introduced into the container 2a through a side wall of the container 2a.

The measuring principles underpinning vibronic and capacitive and/or conductive measuring devices are sufficiently known per se in the state of the art and are therefore not explained further here.

In the case of a field instrument 1 of the invention, the electronics 6 includes a diagnostic unit 10, which serves for executing an embodiment of the diagnostic operating mode of the invention. In the following, three, especially preferred embodiments are explained by way of example for an electronics unit of the invention and for a diagnostic operating mode of the invention. It is to be noted here that the elements shown for the individual embodiments can also be freely adopted for use in other embodiments.

Figure 3:
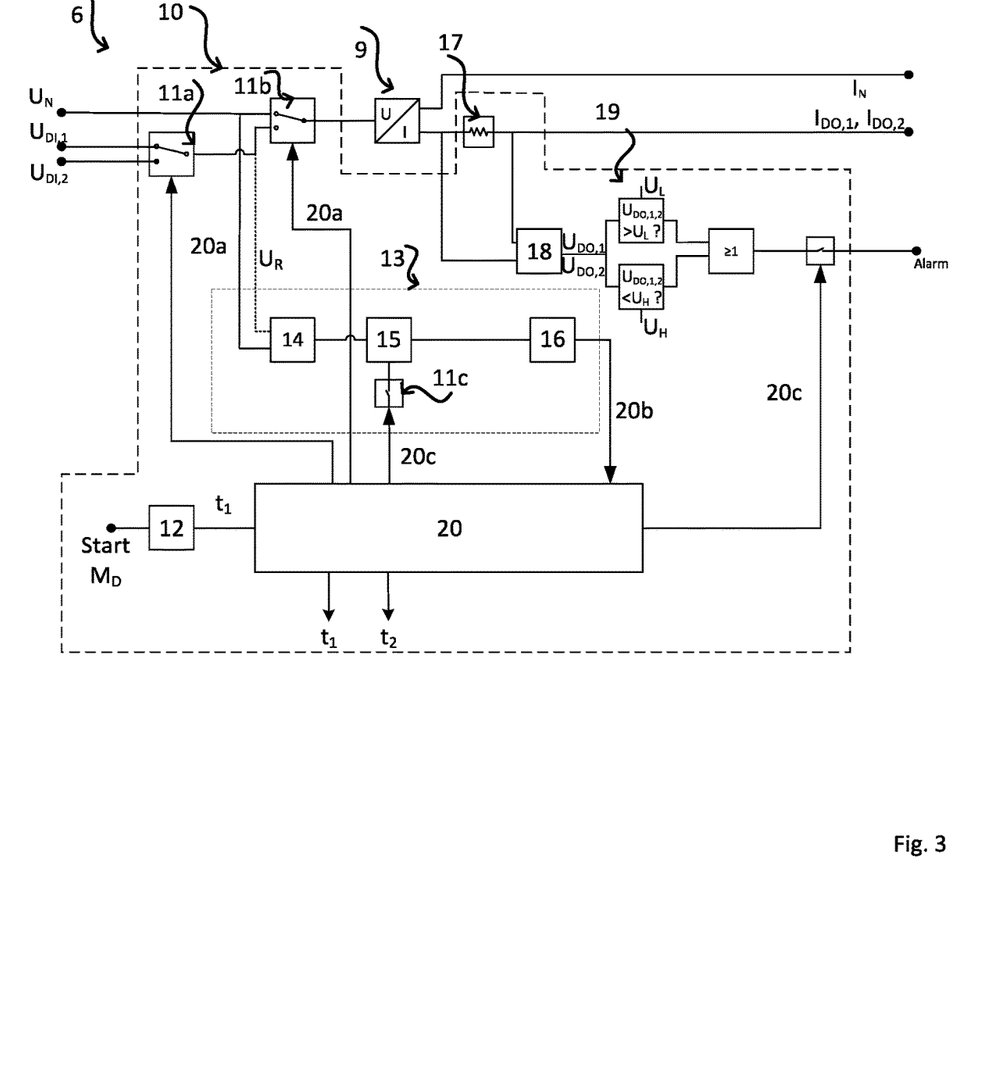
FIG. 3 shows a first embodiment of a diagnostic unit of the present disclosure.

A first possible embodiment is shown in the schematic circuit diagram of FIG. 3. In a normal operating mode $M_N$, an input voltage $U_N$ is produced and an output current $I_N$ representative of a process variable is output. An electronics 6 includes a voltage controlled electrical current source 9. For turning the diagnostic operating mode $M_D$ on and off, the diagnostic unit 10 includes two switching elements 11a and 11b.

At the beginning of the diagnostic operating mode $M_D$, a first time interval $t_1$ is set by means of a monostable multivibrator 12. The switching elements 11a and 11b are suitably set, so that during the first time interval the first diagnosis-input voltage $U_{DI,1}$ is provided and via the voltage controlled electrical current source 9 a corresponding diagnosis-output current $I_{DO,1}$ is output.

At the same time, a second time interval $t_2$ is determined by means of the control unit 13. Control unit 13 includes a subtractor unit 14, an integrator unit 15 and a comparator 16. The integrator unit 15 includes at least one capacitor C and a resistor R. Moreover, via a switching element 11c, the integrator unit 15 is kept in a predeterminable starting state before the beginning of the diagnostic operating mode $M_D$.

By means of the subtractor unit 14, the difference between the input voltage $U_N$ in the normal operating mode $M_N$ and a reference signal $U_R$, which in the present case is the first diagnosis-input voltage $U_{DI,1}$, is formed and fed to the integrator unit 15. The output voltage of the integrator unit 15 rises then, especially linearly, wherein the rise of the voltage depends, among other things, on the value of the first diagnosis-input voltage the capacitance of the capacitor C and the resistance of the resistor R.

After the first time interval ti, the switching elements 11a and 11b are set in such a manner that the second diagnosis-input voltage $U_{DI,2}$ is provided and likewise a corresponding output current $I_{DO,2}$ is output. In this case, the reference signal $U_R$ is the second diagnosis-input voltage $U_{DI,2}$. As a consequence, the polarity of the difference between the input voltage $U_N$ and the reference signal $U_R$ reverses and the voltage at the integrator unit 15 sinks now, especially linearly. Again, the change of the voltage depends, among other things, on the value of the second diagnosis-input voltage $U_{DI,2}$, the capacitance of the capacitor C and the resistance value of the resistor R.

With the help of the comparator 16, that point in time is determined at which a value of the voltage applied to the comparator 16 corresponds to that value which this voltage had at the beginning of the first time interval $t_1$. This point in time defines the end of the second time interval $t_2$. Advantageously, the diagnostic unit 10, especially the control unit 13, can be embodied in such a manner that the end of the second time interval $t_2$ is determinable based on a zero crossing of the voltage applied to the comparator 16. Advantageously, the second time interval can be determined by the control unit 13, especially by the integrator unit 15.

The output current $I_{DO,1}$, $I_{DO,2}$ flowing during the first time interval $t_1$, and the second time interval $t_2$ produces a voltage drop across the resistor 17 and, after processing by means of the subtractor unit 18, the first and second diagnosis-output voltage $U_{DO,1}$, $U_{DO,2}$. Based on the first and second diagnosis-output voltages $U_{DO,1}$ and $U_{DO,2}$, a functionality of the field instrument 1 is checked in the embodiment shown in FIG. 3. The diagnosis-output voltages $U_{DO,1}$ and $U_{DO,2}$ are for this purpose, in each case, fed to the comparator unit 19, which during the diagnostic operating mode $M_D$ checks whether a predeterminable maximum value $U_H$ or a predeterminable minimum value $U_L$ can be output for the first and/or second output current $I_{DO,1}$, $I_{DO,2}$, i.e. for the first and/or second diagnosis-output voltage $U_{DO,1}$, $U_{DO,2}$. If such is not the case, then, for example, a failure message can be output from the field instrument 1 in the form of an alarm.

Furthermore, the diagnostic unit 10 in the present example includes a supervision unit 20. Such is, however, not absolutely necessary. Various measures can be triggered with the supervision unit 20.

For example, the time intervals $t_1$ and $t_2$, and, correspondingly, the switching elements 11a and 11b, can be controlled (20a) by means of the supervision unit 20. The end of the second time interval $t_2$ is ascertained, in such case, by means of the control unit 13, and transmitted to the supervision unit 20 (20b). Also the switching element 11c associated with the integrator unit can be controlled (20c) by the supervision unit 20. Finally, the supervision unit 20 is, furthermore, embodied to publish (20d) failure messages relative to checked functionalities of the field instrument 1. In the illustrated example, the supervision unit 20 can output the values for the first and second time intervals $t_1$ and $t_2$.

Figure 4:
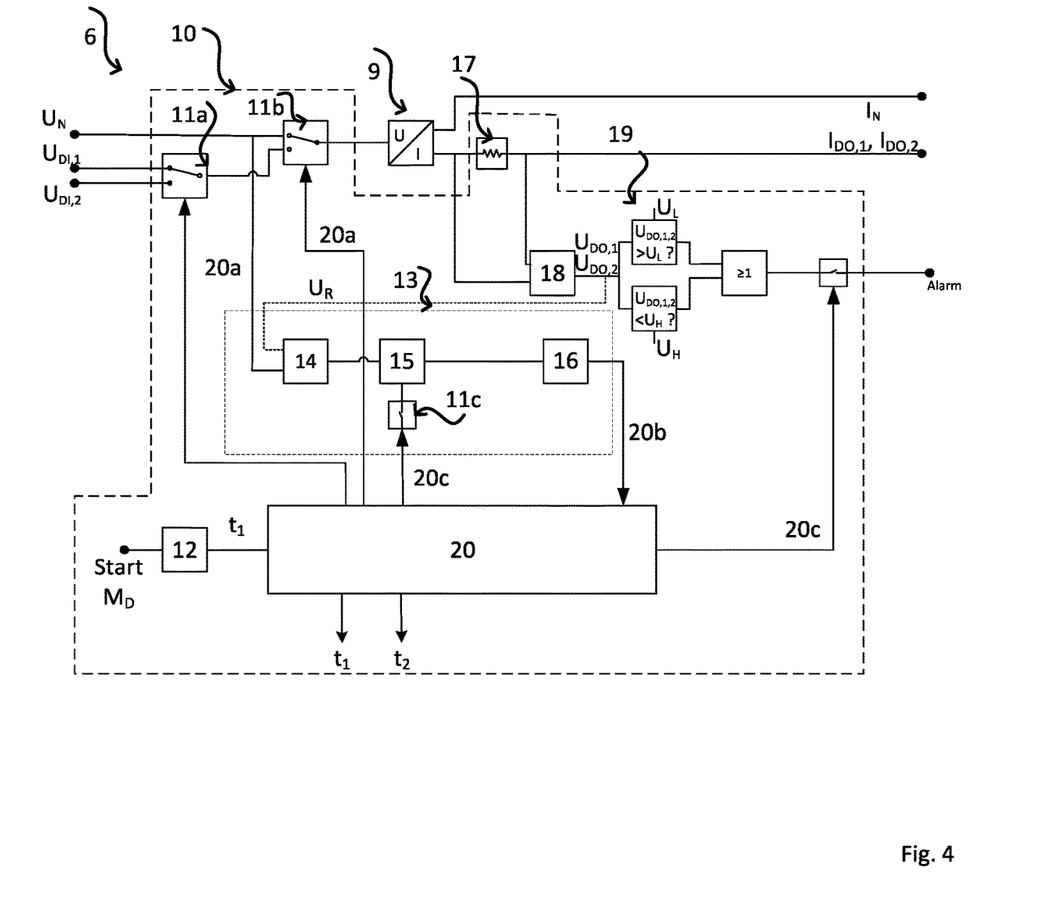
FIG. 4 shows a second embodiment of a diagnostic unit of the present disclosure.

A second possible embodiment of the diagnostic unit 10 is shown in FIG. 4. Elements already explained in connection with FIG. 3 are not explored again in detail for FIG. 4. In contrast with the embodiment shown in FIG. 3, the reference signal $U_R$ in the embodiment of FIG. 4 is the first or the second diagnosis-output signal $U_{DO,1}$, $U_{DO,2}$. This measure takes into consideration that the output electrical current $I_{DO,1}$, $I_{DO,2}$ as a function of time for the voltage controlled electrical current source 9 is not an error-free image of the first and second diagnosis-input voltage $U_{DI,1}$, $U_{DI,2}$, respectively. Since, thus, the first, or second diagnosis-output signal $U_{DO,1}$, $U_{DO,2}$ is selected for the reference signal $U_R$, parasitic circuit parameters can be largely taken into consideration, or compensated.

Figure 5:
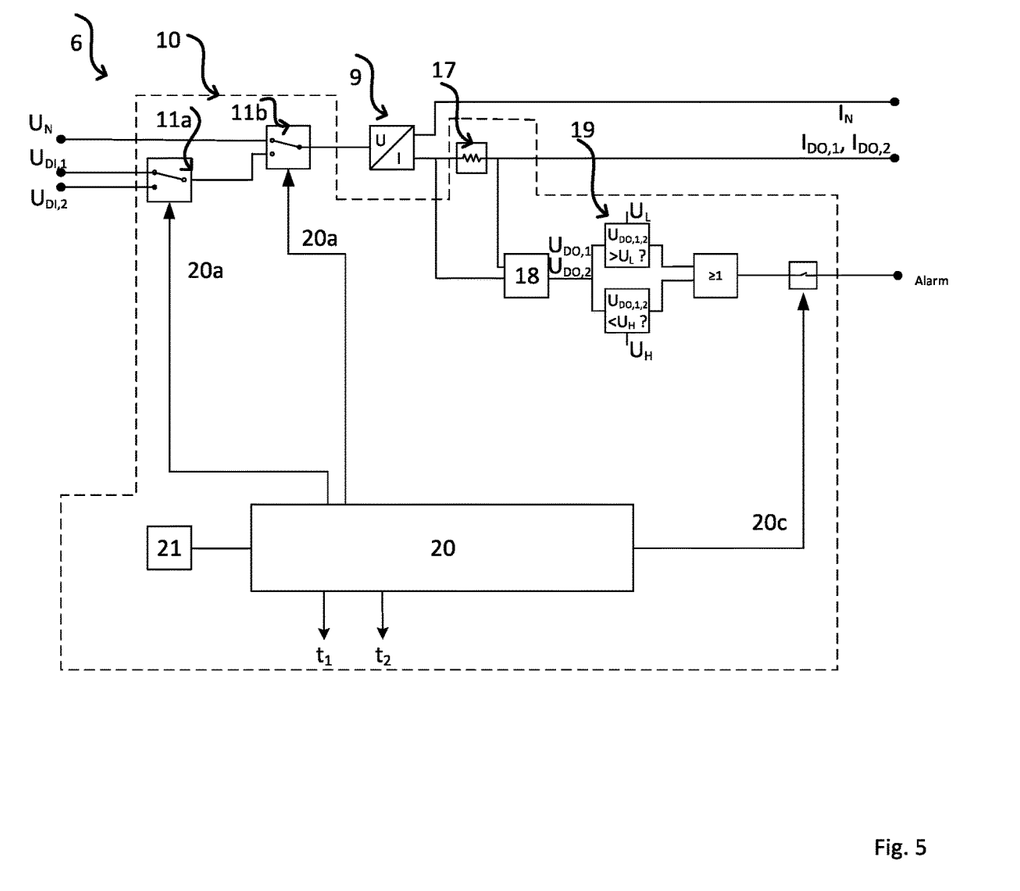
FIG. 5 shows a third embodiment of a diagnostic unit of the present disclosure.

A third and preferred embodiment of the diagnostic unit 10 is shown finally by way of example in FIG. 5. Also in the case of FIG. 5, elements already explained in connection with FIGS. 3 and 4 are not explored again in detail for FIG. 5. In this embodiment, the diagnostic unit 10 comprises instead of the control unit a computing unit 21, which can be a microcontroller, for example. Then, the two time intervals $t_1$ and $t_2$ are determined by the computing unit 21. For this, for example, suitable formulas can be stored in the computing unit 21.

Besides the opportunity to check the ability of the field instrument 1 to output failure information, also other functionalities of the field instrument 1 can be checked. For example, it can be checked whether an output current $I_N$ set in the electrical current loop corresponds to the actual value of the measured variable to be represented. For this, suited especially is an embodiment of the diagnostic unit 10 as shown in FIG. 4.

Based on the first time interval $t_1$, the input voltage $U_N$ and the first and second diagnosis-input voltage $U_{DI,1}$ and $U_{DI,2}$, the second time interval $t_2$ can be calculated based on the following formula:

$$t_2 = -t_1 \frac{U_N - U_{DI,1}}{U_N - U_{DI,2}}$$

This formula can be solved for $U_N$:

$$U_{N,actual} = \frac{t_1 U_{DE,1} + t_2 U_{DE,2}}{t_1 + t_2}$$

The output current $I_N$ corresponds then exactly to the actual value of the measured variable to be represented by $U_N$, when $U_{n,actual}=U_n$.

Figure 6A:
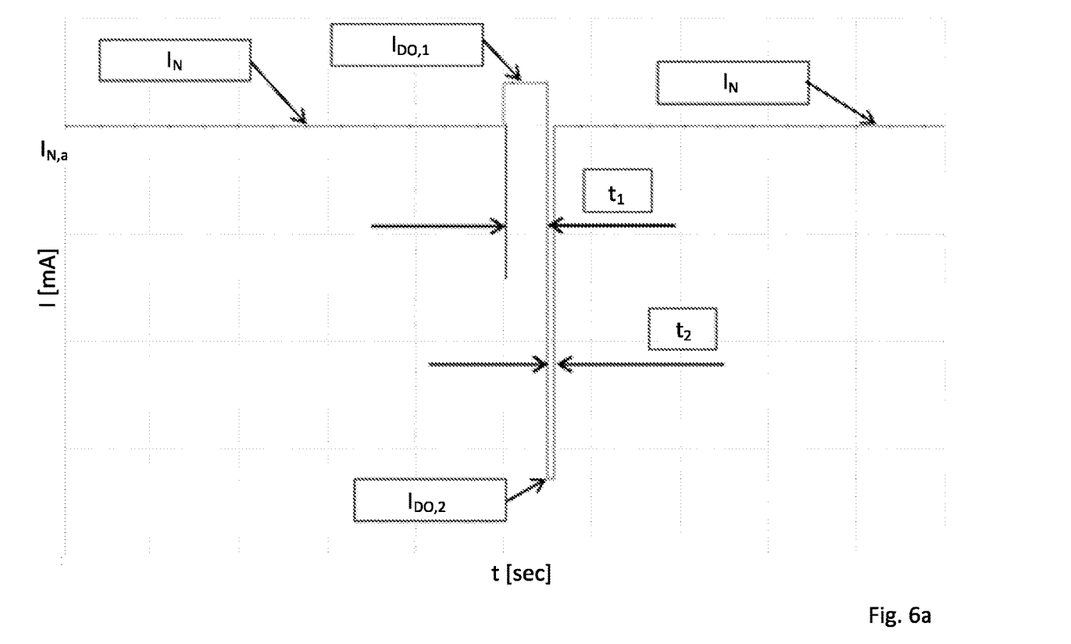
FIG. 6 shows schematic graphs of electrical current output as a function of time, modulated with the first and second diagnosis-input voltages, for different values of the output electrical current in the normal operating mode.
Figure 6B:
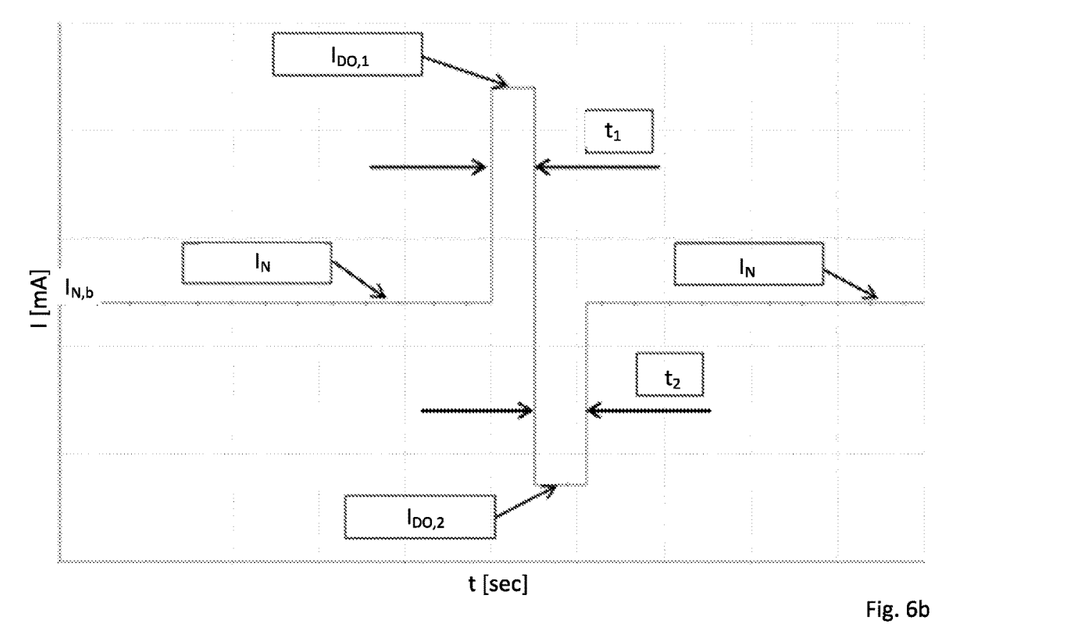

Shown in FIG. 6 are schematic graphs of the first output electrical current $I_{DO,1}$ and the second output electrical current $I_{DO,2}$ of the diagnostic operating mode $M_D$ as a function of time for different values of the output current $I_N$ in the normal operating mode $M_N$. During the normal operating mode $M_N$, the output current $I_N$ lies in the range, 4-20 mA. Furthermore, the output current $I_{N,a}$ in FIG. 6a is greater than the output current $I_{N,b}$ in FIG. 6b. Thus, $I_{N,a} > I_{N,b}$.

During the first time interval $t_1$ of the diagnostic operating mode, the first diagnosis-input voltage $U_{DI,1}$ is provided. Correspondingly, the electrical current increases to the value $I_{DO,1}$. During the second time interval, in contrast, the second diagnosis-input voltage $U_{DI,2}$ is provided, so that the electrical current sinks to the value $I_{DO,2}$. After the second time interval, the output current goes back to $I_{N,a}$. The areal contents of the time integrals of the differences between the first output electrical current $I_{DO,1}$ and the second output electrical current $I_{DO,2}$ on the one hand and the output electrical current $I_N$ in the normal operating mode $M_N$ on the other hand over the first time interval $t_1$ and the second time interval $t_2$, respectively, are essentially equal in magnitude, so that advantageously a DC fraction free modulation of the output electrical current $I_N$ results. FIG. 6b shows the same graph as shown in FIG. 6a, except that the output current $I_{N,b}$ during normal operating mode $M_N$ is less than in FIG. 6a. For assuring a constant component free modulation in this case, the second time interval $t_2$ must be longer than in FIG. 6a. The duration of the second time interval $t_2$ depends, in such case, basically on the input voltage $U_N$.

The invention claimed is:

1. A method for diagnosis of a two-conductor field instrument for determining or monitoring at least one process variable of a medium in a containment, wherein in a normal operating mode an input voltage is provided and an output electrical current is output, and wherein in a diagnostic operating mode a functionality of the two-conductor field instrument is checked, the method comprising:
   providing a first diagnosis-input voltage and outputting a first diagnosis-output electrical current during a first time interval;
   providing a second diagnosis-input voltage and outputting a second diagnosis-output electrical current during a second time interval;
   determining the second time interval at least starting from the first time interval;
   registering a first or second diagnosis-output voltage as a function of the first or second diagnosis-output current; and
   checking the functionality of the two-conductor field instrument based on the first or second diagnosis-input voltage, the first or second time interval, the first or second diagnosis-output electrical current, the first or second diagnosis-output voltage based on the input voltage or based on the output electrical current.

2. The method as claimed in claim 1, further comprising:
   checking whether the two-conductor field instrument can output a predeterminable failure current, including a predeterminable maximum value or a predeterminable minimum value, for the output current;
   checking whether an output current corresponding to a predeterminable input voltage is burdened with an error; or
   checking whether a defect in electronics is present.

3. The method as claimed in claim 1,
   wherein the second time interval is determined starting from the first time interval such that a value of a first integral of a difference between the input voltage and the first diagnosis-input voltage over the first time interval and a value of a second integral of a difference between the input voltage and the second diagnosis-input voltage over the second time interval are equal in magnitude.

4. The method as claimed in claim 1,
   wherein the second time interval is determined as a function of the input voltage.

5. A two-conductor field instrument for determining or monitoring at least one process variable of a medium in a containment, comprising:
   an electronics having a diagnostic unit,
      wherein the electronics is embodied in a normal operating mode to provide an input voltage and to output an output electrical current, and is further embodied in a diagnostic operating mode to check a functionality of the two-conductor field instrument,
      wherein the diagnostic unit is embodied during a first time interval to provide a first diagnosis-input voltage and to output a first diagnosis-output current, during a second time interval to provide a second diagnosis-input voltage and to output a second diagnosis-output current, to determine the second time interval at least starting from the first time interval, as a function of the first or second diagnosis-output current to register a first or second diagnosis-output voltage, and based on the first or second diagnosis-input voltage, the first or second time interval, the first or second diagnosis-output electrical current, the first or second diagnosis-output voltage, based on the input voltage or based on the output electrical current, to check the functionality of the two-conductor field instrument.

6. The two-conductor field instrument as claimed in claim 5,
   wherein the electronics includes at least one switching element.

7. The two-conductor field instrument as claimed in claim 5,
   wherein the electronics includes at least one resistor which serves for producing the first or second diagnosis-output voltage.

8. The two-conductor field instrument as claimed in claim 5,
   wherein the diagnostic unit includes a computing unit which is embodied to ascertain the second time interval at least based on the first time interval.

9. The two-conductor field instrument as claimed in claim 5,
   wherein the diagnostic unit has a control unit, which has at least one subtractor unit, an integrator unit and a comparator.

10. The two-conductor field instrument as claimed in claim 9,
   wherein the integrator unit includes at least one capacitor and one resistor.

11. The two-conductor field instrument as claimed in claim 9,
   wherein the integrator unit includes at least one switching element, which is arranged or embodied such that the integrator unit can be placed in a predeterminable starting state before beginning the diagnostic operating mode by actuating the switching element.

12. The two-conductor field instrument as claimed in claim 9,
   wherein the subtractor unit is embodied to ascertain the difference between a reference signal and the input voltage.

13. The two-conductor field instrument as claimed in claim 12,
   wherein the reference signal involves the first or second diagnosis-input voltage or the first or second diagnosis-output voltage.

14. The two-conductor field instrument as claimed in claim 9,
   wherein the comparator is embodied to ascertain the second time interval based on an input voltage of the integrator unit.

15. The two-conductor field instrument as claimed in claim 5,
   wherein the electronics includes a monostable multivibrator.

\* \* \* \* \*